(12) United States Patent
    Sherrit et al.

(10) Patent No.: US 11,316,447 B2
(45) Date of Patent: Apr. 26, 2022

(54) FLOW ENERGY HARVESTING DEVICES AND SYSTEMS

(71) Applicant: CALIFORNIA INSTITUTE OF TECHNOLOGY, Pasadena, CA (US)

(72) Inventors: Stewart Sherrit, Montrose, CA (US); Hyeong Jae Lee, La Canada, CA (US); Tim Colonius, Sierra Madre, CA (US); Luis Phillipe Tosi, Los Angeles, CA (US)

(73) Assignee: California Institute of Technology, Pasadena, CA (US)

( * ) Notice: Subject to any disclaimer, the term of this patent is extended or adjusted under 35 U.S.C. 154(b) by 888 days.

(21) Appl. No.: 16/087,517

(22) PCT Filed: Mar. 24, 2017

(86) PCT No.: PCT/US2017/024082
    § 371 (c)(1),
    (2) Date: Sep. 21, 2018

(87) PCT Pub. No.: WO2017/196454
    PCT Pub. Date: Nov. 16, 2017

(65) Prior Publication Data
    US 2019/0097548 A1    Mar. 28, 2019

Related U.S. Application Data

(60) Provisional application No. 62/313,619, filed on Mar. 25, 2016.

(51) Int. Cl.
    *H01L 41/113*   (2006.01)
    *H02N 2/18*     (2006.01)
    *E21B 41/00*    (2006.01)

(52) U.S. Cl.
    CPC ......... *H02N 2/185* (2013.01); *E21B 41/0085* (2013.01); *H01L 41/113* (2013.01)

(58) Field of Classification Search
    CPC ... H01L 41/113; H01L 41/185; E21B 41/0085
    See application file for complete search history.

(56) References Cited

U.S. PATENT DOCUMENTS

2002/0039530 A1 * 4/2002 Taneya ................ B41J 2/14048
                                                      417/209
2007/0284969 A1   12/2007 Xu
                    (Continued)

FOREIGN PATENT DOCUMENTS

CN        103199736 A  *  7/2013
WO    WO 2015/154176 A1    10/2015

OTHER PUBLICATIONS

International Search Report and Written Opinion for Application No. PCT/US2017/024082, dated Dec. 15, 2017, 14 pages.

*Primary Examiner* — J. San Martin
(74) *Attorney, Agent, or Firm* — Lewis Roca Rothgerber Christie LLP

(57) ABSTRACT

A flow energy harvesting system including a nozzle-diffuser defining a spline-shaped flow channel and a flow energy harvesting device in the spline-shaped flow channel of the nozzle-diffuser. The spline-shaped flow channel includes a converging portion, a diverging portion, and a constriction section between the converging and diverging portions. The flow energy harvesting device includes a flextensional member having a frame and a cantilever extending outward from the frame, and a stack of piezoelectric elements housed in an interior cavity defined in the frame. The cantilever is a non-piezoelectric material. The frame of the flextensional member is in the converging portion and the cantilever is in the constriction section of the spline-shaped flow channel. The frame is configured to deform and elongate the piezo- (Continued)

electric elements to generate a current based on the piezoelectric effect when a fluid flows through the spline-shaped flow channel and generates unbalanced forces on the cantilever due.

20 Claims, 4 Drawing Sheets

(56) References Cited

U.S. PATENT DOCUMENTS

| | | | |
|---|---|---|---|
| 2008/0277941 A1 | 11/2008 | Bowles et al. | |
| 2009/0140604 A1* | 6/2009 | Chen | H02N 2/185 |
| | | | 310/311 |
| 2010/0308689 A1* | 12/2010 | Rahman | E21B 23/00 |
| | | | 310/328 |
| 2013/0119669 A1 | 5/2013 | Murphree | |
| 2014/0319970 A1 | 10/2014 | Sherrit et al. | |
| 2017/0033713 A1* | 2/2017 | Petroni | H01L 41/047 |
| 2018/0256862 A1* | 9/2018 | Bagwell | A61M 25/0113 |

* cited by examiner

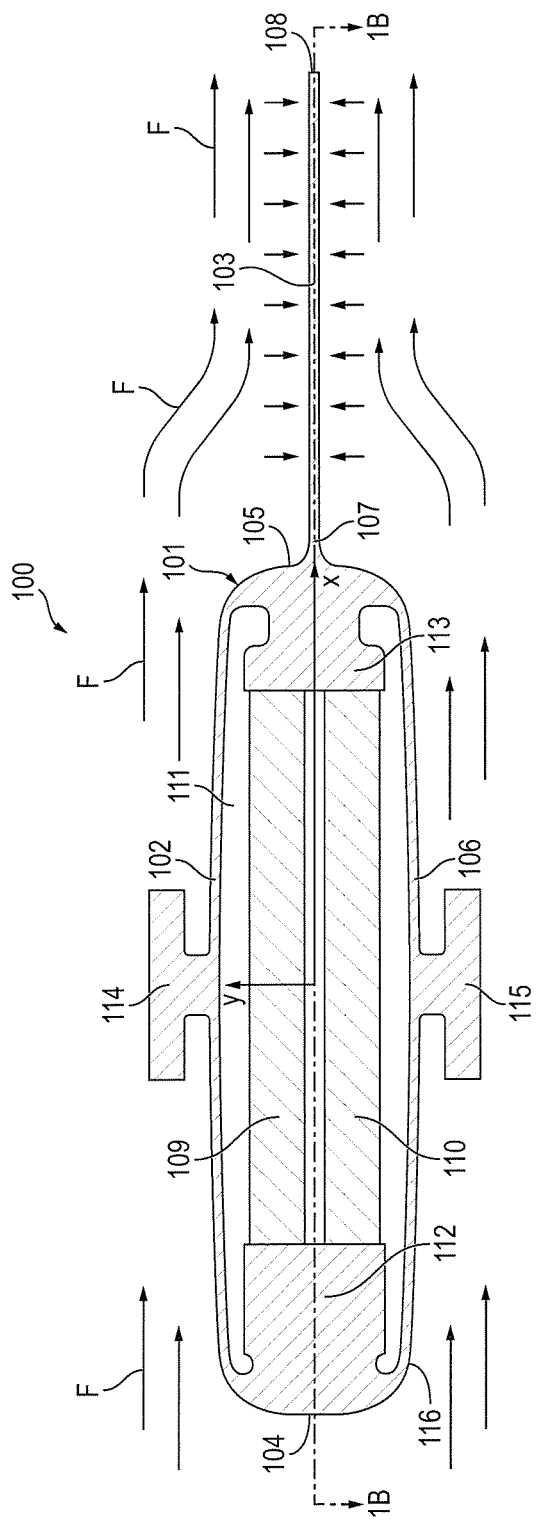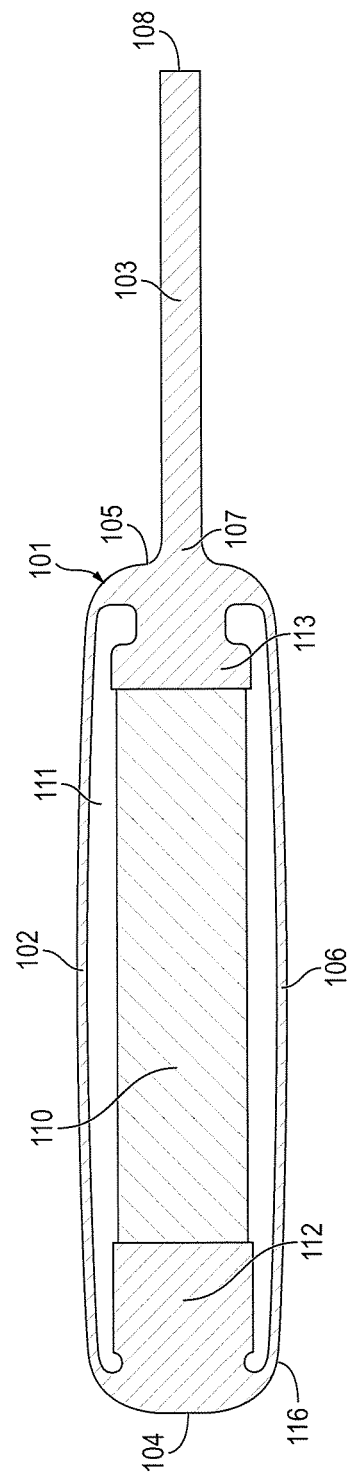
FIG. 1A
FIG. 1B

FLOW ENERGY HARVESTING DEVICES AND SYSTEMS

CROSS-REFERENCED TO RELATED APPLICATIONS

This application is a National Phase Patent Application and claims priority to and the benefit of International Application No. PCT/US2017/024082, filed on Mar. 24, 2017, which claims priority to and the benefit of U.S. Provisional Application No. 62/313,619, filed Mar. 25, 2016, the entire contents of both of which are incorporated herein by reference.

STATEMENT REGARDING FEDERALLY SPONSORED RESEARCH/DEVELOPMENT

The invention described herein was made in the performance of work under a NASA contract NNN12AA01C, and is subject to the provisions of Public Law 96-517 (35 USC 202) in which the Contractor has elected to retain title.

FIELD

The present disclosure relates generally to flow energy harvesting devices.

BACKGROUND

To operate electronics in remote locations, such as sensors or actuators down hole in an oil producing wellbore, power must be transmitted down the wellbore to the electronics or generated down hole in the production zone of the wellbore. However, transmitting power down the wellbore to the electronics is difficult due to the presence of various oil production equipment in the wellbore, such as production packers.

Conventional bimorph cantilever-type piezoelectric energy harvesters, which are typically used in existing vibration-induced energy harvesting devices, may be used to produce power locally near the electronic device requiring power (e.g., an electronic component in a wellbore). Conventional bimorph cantilever-type piezoelectric energy harvesters typically have a low transverse bending stiffness. This low transverse bending stiffness can create large stresses in the piezoelectric elements and therefore large power output with small amplitude forces relative to other conventional piezoelectric actuators. However, conventional bimorph cantilever-type piezoelectric energy harvesters tend to be brittle and therefore may have a short lifetime when subject to large deformations.

SUMMARY

The present disclosure is directed to various embodiments of a flow energy harvesting system configured to generate power. In one embodiment, the flow energy harvesting system includes at least one nozzle-diffuser defining a spline-shaped flow channel, and at least one flow energy harvesting device in the spline-shaped flow channel of the at least one nozzle-diffuser. The spline-shaped flow channel includes a converging portion, a diverging portion, and a constriction section between the converging and diverging portions. The flow energy harvesting device includes a flextensional member having a frame and a cantilever extending outward from the frame. The cantilever is a non-piezoelectric material. The flow energy harvesting device also includes a stack of piezoelectric elements housed in an interior cavity defined in the frame. The frame of the flextensional member is in the converging portion and at least a portion of the cantilever is in the constriction section of the spline-shaped flow channel. The frame is configured to deform and elongate the stack of piezoelectric elements to generate a current based on the piezoelectric effect when a fluid flows through the spline-shaped flow channel and generates unbalanced forces on the cantilever due to aeroelastic flutter A resonant frequency of the frame and stack of piezoelectric elements may be less than a resonant frequency of the cantilever. The stack of piezoelectric elements may be isolated from the spline-shaped flow channel. The flow energy harvesting system may also include a pipe. The at least one nozzle-diffuser may include a series of nozzle-diffusers arranged on an outer surface of the pipe, and the at least one flow energy harvesting device may include a series of flow energy harvesting devices in the series of nozzle-diffusers. At least two flow energy harvesting devices of the series of flow energy harvesting devices may be arranged in parallel or in series. The frame and the cantilever of the flextensional member may each be made of metal. The flow energy harvesting system may also include a pair of opposing transverse standoffs extending outward from the frame of the flextensional member. The pair of opposing transverse standoffs fixedly couple the flextensional member of the at least one flow energy harvesting device to the at least one nozzle-diffuser. A length of each of the piezoelectric elements may be parallel to a length of the cantilever of the flextensional member. The length of each of the piezoelectric elements may greater than a thickness of each of the piezoelectric elements.

The present disclosure is also directed to various method of generating power down hole in a wellbore having a formation wall and a pipe spaced apart from the formation wall by an annular region. In one embodiment, the method includes positioning a flow energy harvesting system in the annular region. The flow energy harvesting system includes a series of nozzle-diffusers defining a series of spline-shaped flow channels, and a series of flow energy harvesting devices in the series of spline-shaped flow channels. Each spline-shaped flow channel includes a converging portion, a diverging portion, and a constriction section between the converging and diverging portions. Each flow energy harvesting device includes a flextensional member having a frame and a cantilever extending outward from the frame. The cantilever includes a non-piezoelectric material. Each flow energy harvesting device also includes a stack of piezoelectric elements housed in an interior cavity defined in the frame. For each of the flow energy harvesting devices, the frame of the flextensional member is in the converging portion of one of the spline-shaped flow channels and at least a portion of the cantilever of the flextensional member is in the constriction section of the spline-shaped flow channel. For each of the flow energy harvesting devices, the frame is configured to deform and elongate the stack of piezoelectric elements to generate a current based on the piezoelectric effect when a fluid flows through the annular region and the plurality of spline-shaped flow channels and generates unbalanced forces on the cantilever due to aeroelastic flutter.

The method may also include transmitting the current to an electronic device in the wellbore. Positioning the flow energy harvesting system in the annular region may include circumferentially arranging the series of nozzle-diffusers and the series of flow energy harvesting devices in the annular region and orienting the spline-shape flow channels parallel to a longitudinal axis of the wellbore. At least two flow energy harvesting devices of the series of flow energy harvesting devices may be arranged in parallel or in series.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

These and other features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale, nor is every feature in the drawings necessarily required to fall within the scope of the described invention.

FIGS. 1A-1B are a vertical cross-sectional view and a horizontal cross-sectional view, respectively, of a flow energy harvesting device according to one embodiment of the present disclosure in an unloaded state;

DETAILED DESCRIPTION

Figure 2A:
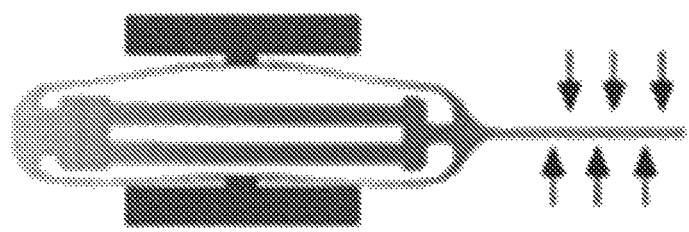
FIGS. 2A-2E depict different degrees of deformation of the embodiment of the flow energy harvesting device illustrated in FIGS. 1A-1B.

The present disclosure is directed to various embodiments of flow energy harvesting devices and systems including a flextensional member having a frame and a cantilever, and a stack of piezoelectric elements housed in the frame. When a fluid (e.g., a gas or a liquid) flows over the flextensional member, unbalanced forces on the cantilever created by aeroelastic flutter (e.g., unsteady flow forces on the cantilever) generate internal stresses in the cantilever. These internal stresses in the cantilever cause deformation of the frame and the stack of piezoelectric elements in the frame, and the deformation of the piezoelectric elements generates a current according to the piezoelectric effect. According to one or more embodiments of the present disclosure, the flow energy harvesting device is configured such that the length-extensional deformation mode (e.g., the elongation deformation mode) of the piezoelectric elements is excited by unbalanced forces on the cantilever. The length-extensional deformation mode (e.g., the elongation deformation mode) of the piezoelectric elements has an energy conversion efficiency that is greater than the transverse deformation mode of the piezoelectric elements that is employed in conventional bimorph cantilever-type piezoelectric energy harvesters.

Additionally, according to one or more embodiments of the present disclosure, the resonant frequency of the piezoelectric elements and the frame may be less than the resonant frequency of the cantilever such that the fluid flow does not need to deflect (e.g., bend) the cantilever to deform the piezoelectric elements and generate current. Accordingly, because the cantilever does not need to be sized to bend, the thickness of the cantilever may be increased compared to conventional bimorph cantilever-type piezoelectric harvesters having relatively thin cantilevers to mitigate fatigue and erosion. Additionally, the piezoelectric elements in the frame of the present disclosure are isolated from the fluid flow around the frame of the flextensional member, which is configured to reduce the effects of corrosion, erosion, and overall degradation on the piezoelectric elements which might otherwise reduce the lifecycle of the device.

The flow energy harvesting devices and systems of the present disclosure may be suitable for use in a variety of energy generation applications, such as, for instance, in the oil industry (e.g., generating power downhole in an oil wellbore to power one or more electric devices in the oil wellbore) and/or in aeronautical and space operations (e.g., generating power from wind or waves on planetary bodies with an atmosphere). By producing power locally near the location of the electronic device requiring power (e.g., sensors and/or actuators), the flow energy harvesting devices and systems of the present disclosure eliminate the need to transmit power over long distances (e.g., down a wellbore), which reduces overall system complexity and the difficulties associated with power transmission.

With reference now to FIGS. 1A-1B, a flow energy harvesting device 100 according to one embodiment of the present disclosure includes a flextensional member 101 having a frame 102 (e.g., a body or a casing) and a cantilever 103 (e.g., a flextensional actuator) connected to the frame 102. In one or more embodiments, the cantilever 103 and the frame 102 may be formed separately and subsequently joined together by any suitable manufacturing process or technique, or the cantilever 103 and the frame 102 may be formed integrally as a monolithic member. In the illustrated embodiment, the frame 102 is an elongate body having a pair of opposing ends 104, 105 (i.e., a leading end 104 and a trailing end 105) and at least one sidewall 106 (e.g., a cylindrical sidewall) extending between the pair of opposing ends 104, 105. In the illustrated embodiment, the cantilever 103 extends outward from the trailing end 105 of the frame 102. The cantilever 103 includes a fixed end 107 (e.g., clamped end) at the trailing end 105 of the frame 102 and a free end 108 opposite to the fixed end 107. The cantilever 103 may have any suitable shape, such as, for instance, a flat plate (e.g., a generally rectangular plate or a generally rectangular beam) or a rod. The flow energy harvesting device 100 of the present disclosure also includes a stack of piezoelectric elements 109, 110 housed in an interior cavity or chamber 111 defined in the frame 102 of the flextensional member 101. In the illustrated embodiment, the interior cavity 111 of the frame 102 is closed or sealed such that the piezoelectric elements 109, 110 housed in the frame 102 are isolated from an exterior of the frame 102 (e.g., the piezoelectric elements 109, 110 housed in the frame 102 isolated from fluid flowing around the frame 102 of the flextensional member 101). Although in the illustrated embodiment the stack includes a pair of piezoelectric elements 109, 110, in one or more embodiments, the stack may include any other suitable number of piezoelectric elements (e.g., more than two piezoelectric elements). In the illustrated embodiment, the cantilever 103 is made from a non-piezoelectric material, such as metal.

In the illustrated embodiment, the flextensional member 101 also includes a pair of opposing support members 112, 113 extending into the interior cavity 111 from the opposite ends 104, 105, respectively, of the frame 102. The support members 112, 113 are configured to support ends of the piezoelectric elements 109, 110 and maintain the piezoelectric elements 109, 110 under a compressive load. Additionally, in the illustrated embodiment, the frame 102 of the flextensional member 101 is configured to survive large amplitude vibrations. The maintenance of the piezoelectric elements 109, 110 under a compressive load and ability of the frame 102 to survive large amplitude vibrations are configured to provide both high energy density in the piezoelectric elements 109, 110 and fatigue resistance of the flextensional member 101. In one or more embodiments, the cantilever 103 and the frame 102 of the flextensional member 101 may both be made of metal.

In the illustrated embodiment, a length of each of the piezoelectric elements 109, 110 is parallel or substantially parallel to a length of the cantilever 103. Additionally, in the illustrated embodiment, the length of each of the piezoelectric elements 109, 110 is greater than a thickness of each of the piezoelectric elements 109, 110. When the flow energy harvesting device 100 is in an unloaded state, as shown in FIGS. 1A-1B, the cantilever 103 extends along an axis that extends between the piezoelectric elements 109, 110 (e.g., the piezoelectric elements 109, 110 are mirrored or centered about the axis along which the cantilever 103 extends when the flow energy harvesting device 100 is in an unloaded state). Additionally, in the illustrated embodiment, the piezoelectric elements 109, 110 are stacked in a direction (e.g., a vertical direction) that is orthogonal or substantially orthogonal to the direction (e.g., a horizontal direction) in which the cantilever 103 extends.

With continued reference to the embodiment illustrated in FIGS. 1A-1B, the flextensional member 101 also includes a pair of opposing transverse standoffs 114, 115. In the illustrated embodiment, the standoffs 114, 115 extend outward from the sidewall 106 of the frame 102 of the flextensional member 101. Although in the illustrated embodiment the flextensional member 101 includes a pair of standoffs 114, 115, in one or more embodiments the flextensional member 101 may include any other suitable number of standoffs, such as three or four standoffs arranged around the sidewall 106 of the frame 102. The standoffs 114, 115 are configured to fixedly couple the frame 102 of the flextensional member 101 to another structure (e.g., a nozzle-diffuser for directing fluid flow over the frame 102 and the cantilever 103 of the flextensional member 101).

When the flow energy harvesting device 100 of the present disclosure is introduced into a fluid flow F (e.g., a gas or liquid flow), the fluid flow F flows along an exterior surface 116 of the frame 102 and over the cantilever 103 of the flextensional member 101. The fluid flow F may be present in a variety of different environments in which it is desired to locally generate power, such as, for instance, liquid flow in a wellbore or wind or waves on a planetary body with an atmosphere. In one or more embodiments, the flow energy harvesting device 100 may be configured to generate power from any fluid flow F having a flow rate of at least approximately 3 L/min. When an uneven or unsteady fluid F flow flows over the cantilever 103, differential/unbalanced forces on or along the cantilever 103 create internal stresses in the cantilever 103. That is, an uneven fluid flow F over the cantilever 103 of the flextensional member 101 may generate aeroelastic flutter (e.g., self-sustained oscillations) at the cantilever 103, which generates internal stresses in the cantilever 103. The internal stresses that develop in the cantilever 103 are effectively countered by a point force and a moment at the interface between the fixed end 107 of the cantilever 103 and the trailing end 105 of the frame 102, which cause deformation of the frame 102 and length-extensional deformation of the stack of piezoelectric elements 109, 110 in the frame 102. The length-extensional deformation of the piezoelectric elements 109, 110 generates a current according to the piezoelectric effect. In the illustrated embodiment, the mechanical advantage between a point force ($F_y$) on the cantilever 103 and the length-extension load ($F_x$) on the frame 102 of the flextensional member 101 and the piezoelectric elements 109, 110 is proportional to $L_x/L_y$, and the force magnitude on the frame 102 of the flextensional member 101 and the piezoelectric elements 109, 110 is amplified if $L_y > L_x$.

Figure 2B:
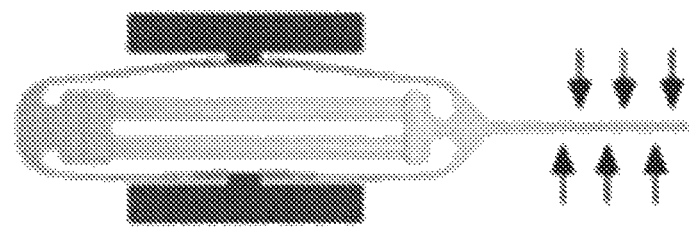
Figure 2C:
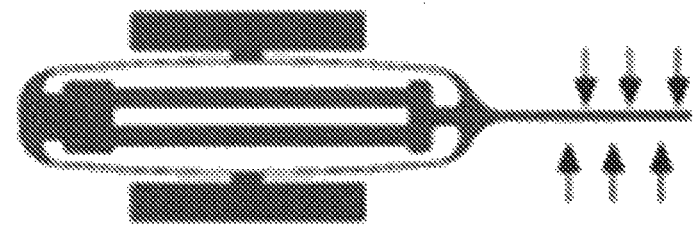
Figure 2D:
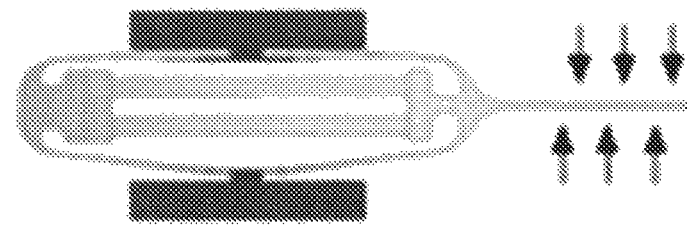
Figure 2E:
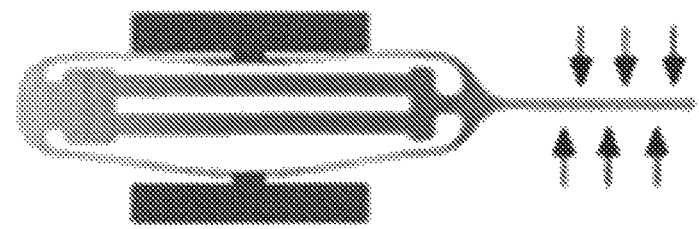

FIGS. 2A-2E depict different degrees of deformation of the frame 102 and the piezoelectric elements 109, 110 when an unsteady fluid flow F flows over the cantilever 103 of the flextensional member 101 (e.g., when aeroelastic flutter is induced or present at the cantilever 103). In FIGS. 2A-2E, the magnitude of the displacement is represented by a color contour, wherein red represents the largest displacement, blue represents the smallest displacement, yellow represents a moderate displacement, and orange represents an intermediate degree of displacement between the displacement levels depicted in yellow and red. The flextensional member 101 is shown in a neutral position (e.g., an undeformed position) in FIG. 2C. FIGS. 2B and 2A depict increasing deformation of the frame 102 in a first direction (e.g., downward) and the resultant increasing elongation (e.g., increasing length-extensional deformation) of the piezoelectric elements 109, 110 in the frame 102, and FIGS. 2D and 2E depict increasing deformation of the frame 102 in a second direction opposite the first direction (e.g., upward) and the resultant increasing elongation (e.g., increasing length-extensional deformation) of the piezoelectric elements 109, 110 in the frame 102.

In the illustrated embodiment, the resonant frequency of the piezoelectric elements 109, 110 and the frame 102 of the flextensional member 101 are less than the resonant frequency of the cantilever 103 of the flextensional member 101. Accordingly, the fluid flow F does not need to deflect (e.g., bend) the cantilever 103 to deform the piezoelectric elements 109, 110 and thereby generate a current according to the piezoelectric effect. Instead, the fluid flow F may excite the flexural mode of the frame 102 and the piezoelectric elements 109, 110 without exciting beam deflection of the cantilever 103. Accordingly, because the cantilever 103 does not need to be sized to enable bending of the cantilever 103, the thickness of the cantilever 103 may be increased compared to conventional bimorph cantilever-type piezoelectric harvesters having thin cantilevers to mitigate fatigue and erosion of the cantilever 103.

In the illustrated embodiment, the piezoelectric elements 109, 110 housed in the interior cavity 111 of the frame 102 of the flextensional member 101 are isolated from the fluid flow F along the exterior surface 116 of the flextensional member 101. Isolating the piezoelectric elements 109, 110 from the fluid flow F is configured to reduce the effects of corrosion, erosion, and overall degradation of the piezoelectric elements 109, 110 which might otherwise reduce the lifecycle of the flow energy harvesting device 100.

Figure 3A:
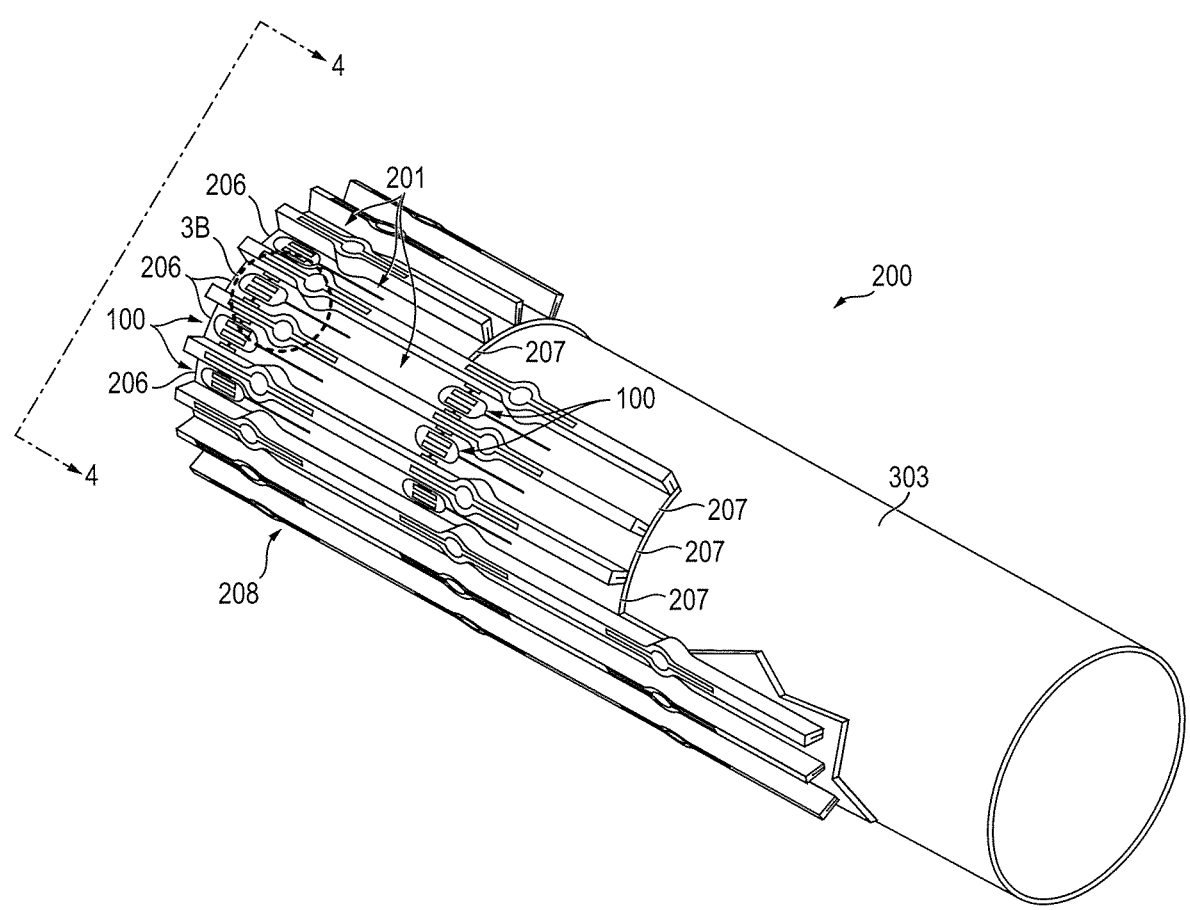
FIGS. 3A and 3B are a cutaway perspective view and an enlarged detailed view, respectively, of a flow energy harvesting system according to one embodiment of the present disclosure including a series of nozzle-diffusers and a series of flow energy harvesting devices in the nozzle-diffusers.
Figure 3B:
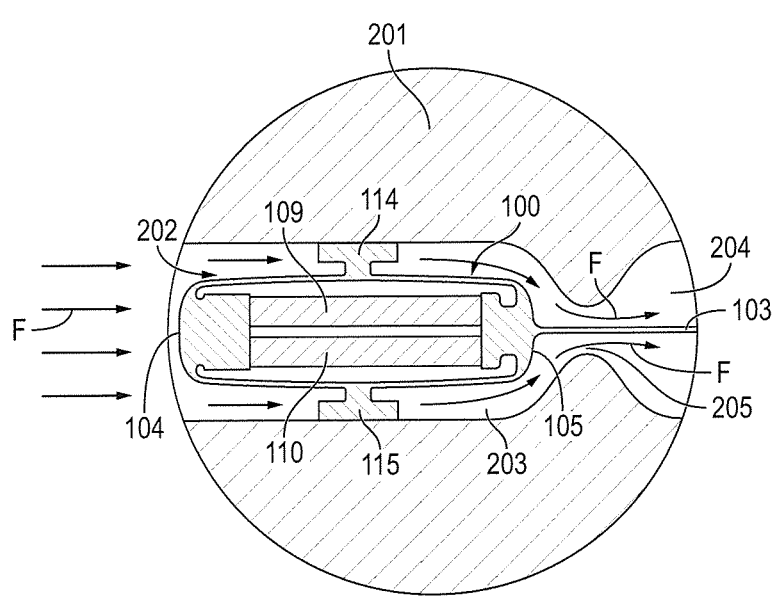

With reference now to FIGS. 3A-3B, a flow energy harvesting system 200 according to one embodiment of the present disclosure includes a series of nozzle-diffusers 201 and a series of flow energy harvesting devices 100. As described in more detailed below, the nozzle-diffusers 201 are configured to direct a fluid flow over the flow energy harvesting devices 100 to excite the length-extensional deformation mode of the flow energy harvesting devices 100 and thereby generate an electric output via the piezoelectric effect. The flow energy harvesting devices 100 may have any configuration described above with reference to the embodiment illustrated in FIGS. 1A-1B. In the illustrated embodiment, each of the nozzle-diffusers 201 defines a spline-shaped flow channel 202 having a converging portion 203 (e.g., a nozzle section), a diverging portion 204 (e.g., a diffuser section), and a constriction section 205 between the converging and diverging portions 203, 204. Additionally, in the illustrated embodiment, the spline-shaped flow channel 202 includes an inlet 206 upstream of the converging portion 203 and an outlet 207 downstream of the diverging portion 204.

The flow energy harvesting devices are arranged in the spline-shaped flow channels 202 of the nozzle-diffusers 201. In the illustrated embodiment, the frames 102 of the flextensional members 101 are in the converging portions 203 of the flow channels 202 and the cantilevers 103 extend into the constriction sections 205 of the flow channels 202. Additionally, in the illustrated embodiment, end portions of the cantilevers 103 extend into the diverging portions 204 of the flow channels 202. The transverse standoffs 114, 115 on the frames 102 of the flextensional members 101 fixedly couple the frames 102 to portions of the nozzle-diffusers 201 (e.g., to the converging portions 203 of the spline-shaped flow channels 202).

In the illustrated embodiment, the series of nozzle-diffusers 201 and the series of flow energy harvesting devices 100 are arranged circumferentially. Together, the circumferentially arranged nozzle-diffusers 201 and energy harvesting devices 100 define an annular band 208. Flow energy harvesting devices 100 in adjacent circumferential positions on the annular band 208 are arranged in parallel. Additionally, in the illustrated embodiment, each radial position of the annular band 208 includes three nozzle-diffusers 201 arranged in series and three flow energy harvesting devices 100 arranged in series. In one or more embodiments, each radial position of the annular band 208 may include any other suitable number of nozzle-diffusers 201 and a corresponding number of flow energy harvesting devices 100 (e.g., each radial position of the annular band 208 may include a single nozzle-diffuser 201 and a single flow energy harvesting device 100, a pair of nozzle-diffusers 201 and a pair of corresponding flow energy harvesting devices 100, or more than three nozzle-diffusers 201 and more than three corresponding flow energy harvesting devices 100). Accordingly, in the illustrated embodiment, the nozzle-diffusers 201 and the flow energy harvesting devices 100 of the annular band 208 are arranged in both parallel and in series. In one or more embodiments, the nozzle-diffusers 201 and the flow energy harvesting devices 100 may be arranged only in parallel or only in series.

When the flow energy harvesting system 200 of the present disclosure is introduced into a fluid flow F (e.g., a gas or liquid flow), the fluid flow F first flows into the inlets 206 in the flow channels 202 of the nozzle-diffusers 201 and is then compressed by the converging portions 203 (e.g., the nozzle sections) and the constriction sections 205 of the flow channels 202. The fluid flow F then expands through the diverging portions 204 (e.g., the diffuser sections) of the flow channels 202 and then exits through the outlets 207. As the fluid flow F flows through the converging portions 203 of the flow channels 202, the fluid flow F flows over the frames 102 of the flextensional members 101. As the fluid flow F flows through the constriction sections 205 of the flow channels 202 and expands through the diverging portions 204 of the flow channels 202, the fluid flow F flows over the cantilevers 103 of the flextensional members 101. The fluid flow F through the spline-shaped flow channels 202 tends to produce aeroelastic flutter (e.g., an uneven or unstable flow) at the cantilevers 103 of the flow energy harvesting devices 100. This unstable flow over the cantilevers 103 creates differential/unbalanced forces and internal stresses in the cantilevers 103. These internal stresses in the cantilevers 103 cause length-extensional deformation of the frames 102 and the stack of piezoelectric elements 109, 110 in each of the flextensional members 101, and the length-extensional deformation of the piezoelectric elements 109, 110 generates a current according to the piezoelectric effect.

The length-extensional deformation mode of the piezoelectric elements 109, 110 has an energy conversion efficiency that is greater (e.g., approximately 3-5 times greater) than a transverse deformation mode of the piezoelectric elements, which is employed in conventional bimorph cantilever-type piezoelectric energy harvesters. In one or more embodiments, one of the flow energy harvesting devices 100 in one of the nozzle-diffusers 201 is configured to generate a power output of approximately 0.18 W at an aeroelastic flutter frequency of the fluid flow F of approximately 300 Hz. In one or more embodiments, one of the flow energy harvesting devices 100 in one of the nozzle-diffusers 201 is configured to generate a power output in the range of hundreds of Milliwatts (e.g., approximately 200 mW to approximately 500 mW). The flow energy harvesting devices 100 of the flow energy harvesting system 200 may be electrically wired together such that the current generated from each of the flow energy harvesting devices 100 may be transmitted into a single electrical line and then transmitted to one or more electronic devices requiring power. In one or more embodiments, the total power produced from the combined flow energy harvesting devices 100 may be from approximately 1 W to approximately 2 W, although in one or more embodiments the total power produced may exceed 2 W by, for example, increasing the number of flow energy harvesting devices 100 in the flow energy harvesting system 200.

Figure 4:
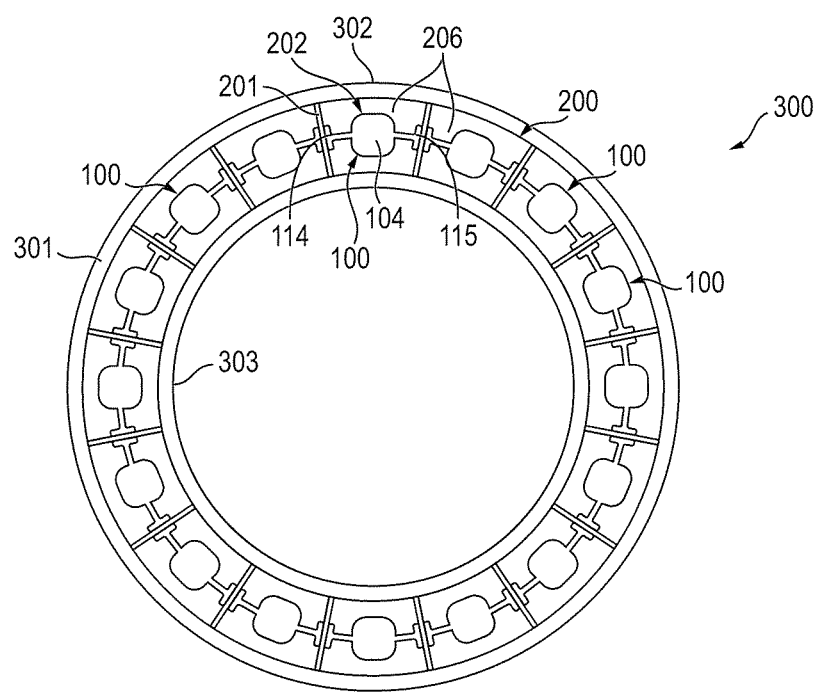
FIG. 4 is a cross-sectional end view of the embodiment of the flow energy harvesting system illustrated in FIG. 3A in an annular region of a wellbore configured to generate electricity down hole in the wellbore from fluid flowing through the annular region of the wellbore.

FIG. 4 depicts the flow energy harvesting system 200 of the present disclosure installed down hole in a wellbore 300 such that the flow energy harvesting system 200 is configured to generate power and supply power to one or more electronic devices down hole in the wellbore 300. In the illustrated embodiment, the flow energy harvesting system 200 is installed in an annular region 301 defined between a formation wall 302 (e.g., a reservoir rock formation) (or a casing against the formation wall 302) and a pipe 303 (e.g., completion tubing). When the flow energy harvesting system 200 is installed in the annular region 301 of the wellbore 300, the spline-shape flow channels 202 are oriented parallel or substantially parallel to a longitudinal axis of the wellbore 300. When a fluid (e.g., drilling fluid) flows through the annular region 301 and through the flow energy harvesting system 200 (i.e., through the spline-shape flow channels 202 and over the flow energy harvesting devices 100), the flow energy harvesting devices 100 are configured to generate power via the piezoelectric effect, which may be used to power one or more electronic device in the wellbore 300. In one or more embodiments, the flow energy harvesting system 200 of the present disclosure may be employed in any other environment in which it is desired to generate power, such as, for instance, in the atmosphere or in a body of water on a planetary body to generate electricity from wind or waves.

While this invention has been described in detail with particular references to embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention. Although relative terms such as "outer," "inner," "upper," "lower," and similar terms have been used herein to describe a spatial relationship of one element to another, it is understood that these terms are intended to encompass different orientations of the various elements and components of the invention in addition to the orientation depicted in the figures. Additionally, as used herein, the term "substantially," "generally," and similar terms are used as terms of approximation and not as terms of degree, and are intended to account for the inherent deviations in measured or calculated values that would be recognized by those of ordinary skill in the art. Furthermore, as used herein, when a component is referred to as being "on" or "coupled to" another component, it can be directly on or attached to the other component or intervening components may be present therebetween. Further, any described feature is optional and may be used in combination with one or more other features to achieve one or more benefits.

What is claimed is:

1. A flow energy harvesting system, comprising:
   at least one nozzle-diffuser defining a spline-shaped flow channel, the spline-shaped flow channel comprising a converging portion, a diverging portion, and a constriction section between the converging and diverging portions; and
   at least one flow energy harvesting device in the spline-shaped flow channel of the at least one nozzle-diffuser, the at least one flow energy harvesting device comprising:
      a flextensional member having a frame and a cantilever extending outward from the frame, the cantilever comprising a non-piezoelectric material; and
      a stack of piezoelectric elements housed in an interior cavity defined in the frame,
      wherein the frame of the flextensional member is in the converging portion and at least a portion of the cantilever is in the constriction section of the spline-shaped flow channel, and
      wherein, the frame is configured to deform and elongate the stack of piezoelectric elements to generate a current based on the piezoelectric effect when a fluid flows through the spline-shaped flow channel and generates unbalanced forces on the cantilever due to aeroelastic flutter.

2. The flow energy harvesting system of claim 1, wherein a resonant frequency of the frame and stack of piezoelectric elements is less than a resonant frequency of the cantilever.

3. The flow energy harvesting system of claim 1, wherein the stack of piezoelectric elements is isolated from the spline-shaped flow channel.

4. The flow energy harvesting system of claim 1, further comprising:
   a pipe,
      wherein the at least one nozzle-diffuser comprises a plurality of nozzle-diffusers arranged on an outer surface of the pipe, and
      wherein the at least one flow energy harvesting device comprises a plurality of flow energy harvesting devices in the plurality of nozzle-diffusers.

5. The flow energy harvesting system of claim 4, wherein at least two flow energy harvesting devices of the plurality of flow energy harvesting devices are arranged in parallel or in series.

6. The flow energy harvesting system of claim 1, wherein the frame and the cantilever of the flextensional member each comprise metal.

7. The flow energy harvesting system of claim 1, further comprising a pair of opposing transverse standoffs extending outward from the frame of the flextensional member, the pair of opposing transverse standoffs fixedly coupling the flextensional member of the at least one flow energy harvesting device to the at least one nozzle-diffuser.

8. The flow energy harvesting system of claim 1, wherein a length of each of the piezoelectric elements is parallel to a length of the cantilever of the flextensional member.

9. The flow energy harvesting system of claim 8, wherein the length of each of the piezoelectric elements is greater than a thickness of each of the piezoelectric elements.

10. A flow energy harvesting device comprising:
    a flextensional member comprising:
       a frame defining an interior cavity; and
       a cantilever extending outward from the frame, the cantilever comprising a non-piezoelectric material; and
       a stack of piezoelectric elements housed in the interior cavity of the frame,
    wherein a fixed end of the cantilever is connected to an end of the stack of piezoelectric elements at a trailing end of the frame.

11. The flow energy harvesting device of claim 10, wherein a resonant frequency of the frame and the stack of piezoelectric elements is less than a resonant frequency of the cantilever.

12. The flow energy harvesting device of claim 10, wherein the stack of piezoelectric elements is isolated from an exterior of the frame of the flextensional member.

13. The flow energy harvesting device of claim 10, wherein the frame and the cantilever of the flextensional member each comprise metal.

14. The flow energy harvesting device of claim 10, further comprising a pair of opposing transverse standoffs extending outward from the frame of the flextensional member, the pair of opposing transverse standoffs configured to fixedly couple the flextensional member to a structure.

15. The flow energy harvesting device of claim 10, wherein a length of each of the piezoelectric elements is parallel to a length of the cantilever of the flextensional member.

16. The flow energy harvesting device of claim 15, wherein the length of each piezoelectric element is greater than a thickness of each piezoelectric element.

17. A method of generating power down hole in a wellbore having a formation wall and a pipe spaced apart from the formation wall by an annular region, the method comprising:
    positioning a flow energy harvesting system in the annular region, the flow energy harvesting system comprising:

a plurality of nozzle-diffusers defining a plurality of spline-shaped flow channels, each spline-shaped flow channel comprising a converging portion, a diverging portion, and a constriction section between the converging and diverging portions; and a plurality of flow energy harvesting devices in the plurality of spline-shaped flow channels, each flow energy harvesting device comprising:

a flextensional member having a frame and a cantilever extending outward from the frame, the cantilever comprising a non-piezoelectric material; and a stack of piezoelectric elements housed in an interior cavity defined in the frame, wherein, for each of the plurality of flow energy harvesting devices, the frame of the flextensional member is in the converging portion of one of the spline-shaped flow channels and at least a portion of the cantilever of the flextensional member is in the constriction section of the one of the spline-shaped flow channels, and wherein, for each of the plurality of flow energy harvesting devices, the frame is configured to deform and elongate the stack of piezoelectric elements to generate a current based on the piezoelectric effect when a fluid flows through the annular region and the plurality of spline-shaped flow channels and generates unbalanced forces on the cantilever due to aeroelastic flutter.

18. The method of claim 17, further comprising transmitting the current to an electronic device in the wellbore.

19. The method of claim 17, wherein the positioning of the flow energy harvesting system in the annular region comprises circumferentially arranging the plurality of nozzle-diffusers and the plurality of flow energy harvesting devices in the annular region and orienting the spline-shape flow channels parallel to a longitudinal axis of the wellbore.

20. The method of claim 17, wherein at least two flow energy harvesting devices of the plurality of flow energy harvesting devices are arranged in parallel or in series.

\* \* \* \* \*